(12) United States Patent (10) Patent No.: US 9,368,237 B2
An et al. (45) Date of Patent: Jun. 14, 2016

(54) SEMICONDUCTOR INTEGRATED CIRCUIT CAPABLE OF CONTROLLING TEST MODES WITHOUT STOPPING TEST

(75) Inventors: Sun Mo An, Gyeonggi-do (KR); Shin Ho Chu, Gyeonggi-do (KR)

(73) Assignee: HYNIX SEMICONDUCTOR INC., Gyeonggi-do (KR)

( * ) Notice: Subject to any disclaimer, the term of this patent is extended or adjusted under 35 U.S.C. 154(b) by 2025 days.

(21) Appl. No.: 12/483,372

(22) Filed: Jun. 12, 2009

(65) Prior Publication Data

US 2010/0032669 A1 Feb. 11, 2010

(30) Foreign Application Priority Data

Aug. 8, 2008 (KR) .................. 10-2008-0077705

(51) Int. Cl.
*G11C 29/46* (2006.01)
(52) U.S. Cl.
CPC ..................................... *G11C 29/46* (2013.01)
(58) Field of Classification Search
CPC ........ H01L 23/58; G11C 29/46; G11C 29/00; G01R 21/28; G01R 31/3185
USPC .................. 324/762.01, 762.03, 512; 257/48, 257/E23.002
See application file for complete search history.

(56) References Cited

U.S. PATENT DOCUMENTS

| 5,905,690 | A | 5/1999 | Sakurai et al. | |
| 6,459,636 | B2 | 10/2002 | Lee et al. | |
| 2001/0017804 | A1* | 8/2001 | Ito ......................... | G11C 29/46 365/201 |
| 2002/0149013 | A1* | 10/2002 | Sato et al. ....................... | 257/48 |
| 2007/0171738 | A1* | 7/2007 | Kim et al. ..................... | 365/201 |

FOREIGN PATENT DOCUMENTS

JP 2001-014897 A 1/2001
JP 2002-313098 A 10/2002

* cited by examiner

*Primary Examiner* — Son Le
*Assistant Examiner* — Brent J Andrews
(74) *Attorney, Agent, or Firm* — Ladas & Parry LLP

(57) ABSTRACT

A semiconductor integrated circuit capable of controlling test modes without stopping testing of the semiconductor integrated circuit is presented. The semiconductor integrated circuit includes a test mode control unit configured to produce, in response to address decoding signals, a plurality of test mode signals of a first group and a plurality of test mode signals of a second group. The test mode control unit selectively inactivates the test mode signals of the first group by providing a reset signal using the test mode signals of the second group. Therefore, the testing time of the semiconductor integrated circuit can be reduced by inactivating the previous test mode using the reset signal and by executing a new test mode without disconnecting the test mode state.

4 Claims, 5 Drawing Sheets

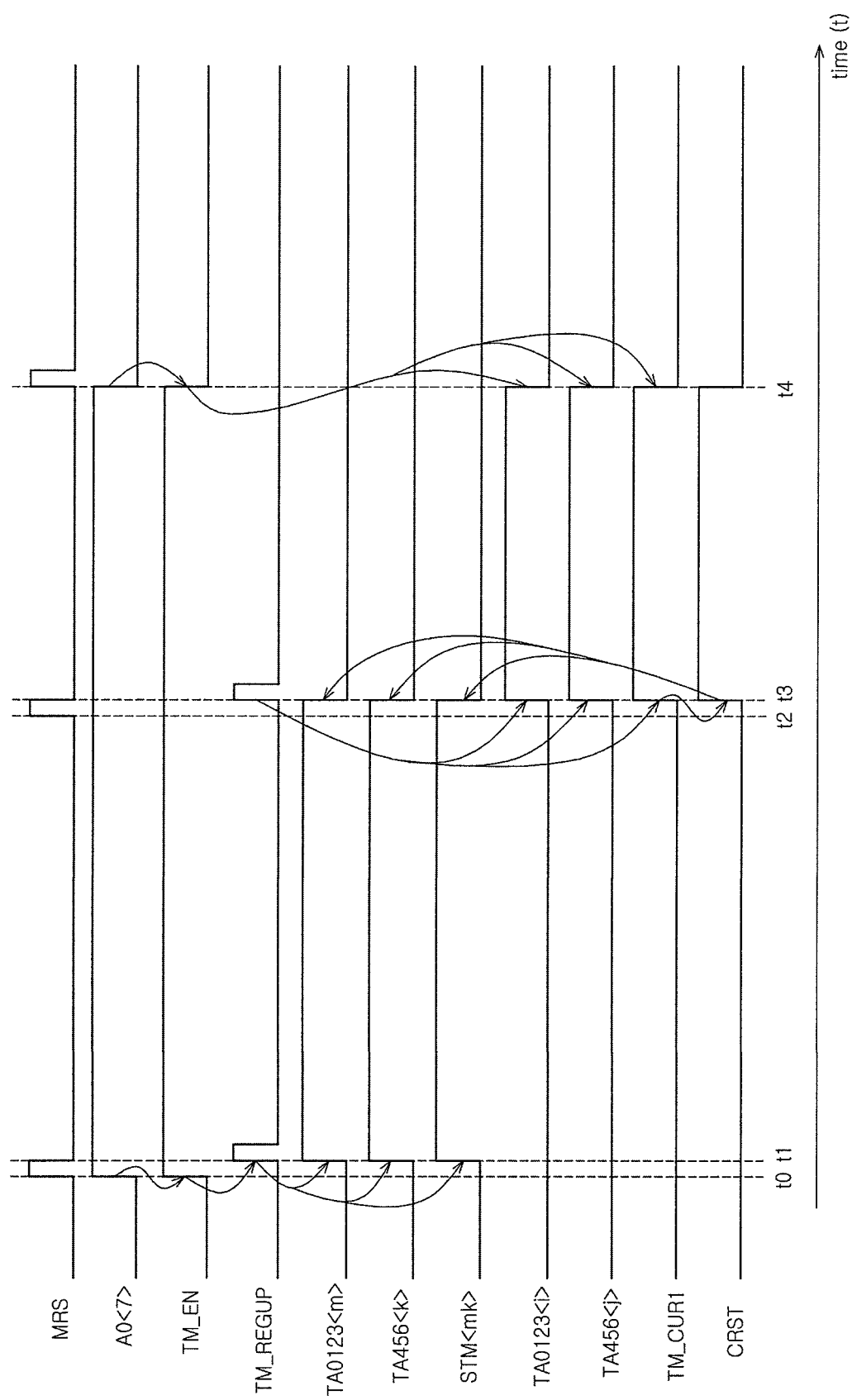

SEMICONDUCTOR INTEGRATED CIRCUIT CAPABLE OF CONTROLLING TEST MODES WITHOUT STOPPING TEST

CROSS-REFERENCES TO RELATED APPLICATION

The present application claims priority under 35 U.S.C. 119(a) to Korean application number 10-2008-0077705, filed on Aug. 8, 2008, in the Korean Patent Office, which is incorporated by reference in its entirety as if set forth in full.

BACKGROUND OF THE INVENTION

1. Technical Field

The embodiments described herein relate to a semiconductor integrated circuit and, more particularly, to a semiconductor integrated circuit capable of controlling a test mode.

2. Related Art

Generally, in a semiconductor integrated circuit, faulty analysis and performance of a device are carried out by executing an internal operation test in a test mode. The test mode of the semiconductor integrated circuit can be classified into as either a concurrent test or as a current test. The concurrent test is a simultaneous test in which a plurality of different test modes are executed at the same time in response to various control signals. The current test is a single test mode in which only one test mode is executed in response to the control signals. Accordingly, the concurrent test is preferred because it is capable of simultaneously performing different tests to the semiconductor integrated circuit and therefore a reduction in test time can be realized. To reset the concurrent test, a mode exit has to be achieved appropriately and this mode exit can be made by applying a reset signal using an external signal, e.g., a MRS (Mode Register Set) signal. However in the situation where a specific test mode cannot be executed simultaneously with another different test mode then a current test is needed in which the semiconductor integrated circuit must enter a test mode of the current test after existing a test mode of the concurrent test. As a result, the total test time is increased and this increased total test time can adversely affect the production throughput of the semiconductor integrated circuits.

SUMMARY

A semiconductor integrated circuit capable of selectively inactivating an activated test mode signal by using predetermined test mode signals as a reset signal is described herein.

According to one aspect, a semiconductor integrated circuit comprises a test mode control unit configured to produce a plurality of test mode signals of a first group and a plurality of test mode signals of a second group in response to address decoding signals, wherein the test mode control unit selectively inactivates the test mode signals of the first group, by providing a reset signal using the test mode signals of the second group.

According to another aspect, a semiconductor integrated circuit comprises an address decoder configured to decode address signals and configured to provide a plurality of test mode control signals of first and second groups; a test mode reset signal generating unit configured to provide test mode signals of the second group and a reset signal in response to the test mode control signal of the second group at a test mode; and a test mode signal selection unit configured to provide a plurality of test mode signals of the first group in response to the plurality of the test mode control signals of the first group, wherein a test mode is maintained when the reset signal is activated, wherein an activated test mode signal of the plurality of the test mode signals of the first group is inactivated, and wherein the plurality of the test mode signals of the second group are activated.

According to yet another aspect, a semiconductor integrated circuit comprises an address decoder configured to decode address signals and provide a plurality of test mode control signals; and a test mode control unit configured to produce a reset signal and test mode signals of first and second groups in response a test mode activation signal and the plurality of the test mode control signals, wherein, when at a test mode, a plurality of signals of the test mode signals of the first group are activated while the reset signal is inactivated, and wherein the test mode signals of the first group are inactivated and any one of the test mode signals of the second group is activated when the reset signal is activated.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIG. 6 is a timing chart showing an operation of the semiconductor integrated circuit in FIG. 1.

DETAILED DESCRIPTION

Figure 1:
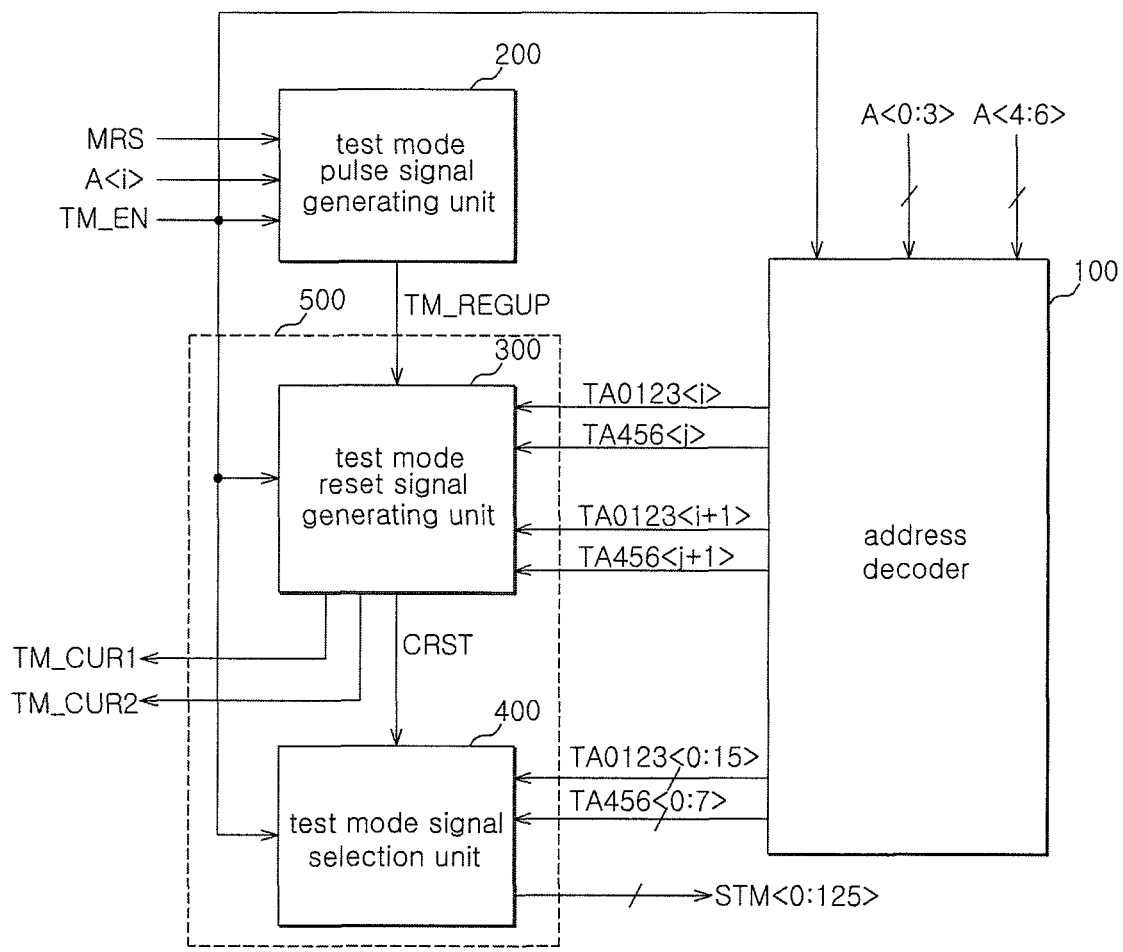
FIG. 1 is a block diagram illustrating an example of a structure of a semiconductor integrated circuit according to one embodiment.

FIG. 1 is a block diagram illustrating an example of a structure of a semiconductor integrated circuit according to one embodiment.

Referring to FIG. 1, a semiconductor integrated circuit according to one embodiment can include an address decoder 100, a test mode pulse signal generating unit 200, and a test mode control unit 500.

The address decoder 100 provides address decoding signals, e.g., a plurality of test mode control signals 'TA0123<0:15>' and 'TA456<0:7>', by decoding a plurality of address signals 'A<0:3>' and 'A<4:6>'.

The test mode pulse signal generating unit 200 provides a pulse signal 'TM_REGUP', which is activated at the time of test, by using a test mode activation signal 'TM_EN', a MRS (Mode Register Set) signal, and a predetermined address signal that is not used in the decoding operation. Here, for example, the predetermined address signal can be, but not limited to, an address signal 'A<7>'.

At the test mode, the test mode control unit 500 provides a plurality of test mode signals 'STM<0:125>' in response to the plurality of test mode control signals 'TA0123<0:15>' and 'TA456<0:7>'. The test mode control unit 500 according to one embodiment selectively inactivates the plurality of test mode signals 'STM<0:125>' by providing a reset signal 'CRST' using predetermined control and mode signals. The test mode control unit 500 can include a test mode reset signal generating unit 300 and a test mode signal selection unit 400.

In more detail, the test mode reset signal generating unit 300 provides the reset signal 'CRST' and predetermined test mode signals 'TM_CUR1' and 'TM_CUR2' in response to the test mode activation signal 'TM_EN', the pulse signal 'TM_REGUP', and the predetermined test mode control signals 'TA0123<i>', 'TA456<j>', 'TA0123<i+1>', and 'TA456<j+1>'. The reset signal 'CRST', according to one embodiment, can include information about predetermined test mode signals, e.g., the predetermined test mode control signals 'TA0123<i>', 'TA456<j>', 'TA0123<i+1>', and 'TA456<j+1>'. Here, for convenience in illustration, the predetermined test mode signals 'TM_CUR1' and 'TM_CUR2' are illustrated as test mode signals for a single test mode in the current test. Meanwhile, for convenience in illustration, the predetermined test mode signals are called as a second test mode signal group hereinafter.

The test mode signal selection unit 400 can provide the plurality of the test mode signals 'STM<0:125>' in response to the plurality of the test mode control signals 'TA0123<0:15>' and 'TA456<0:7>'. Here, for convenience in illustration, the plurality of the test mode signals 'STM<0:125>' are called as a first test mode signal group and can be exemplarily illustrated as a test mode signal group which is implemented in the concurrent test. Here, the number of the test mode signals 'STM<0:125>' of the first group can be taken by subtracting the test mode signals 'TM_CUR1' and 'TM_CUR2' of the second group from the total number of combination signals of the plurality of the test mode control signals. Therefore, while the reset signal 'CRST' is inactivated, a plurality of signals of the test mode signals 'STM<0:125>' of the first group can be activated. However, if the reset signal 'CRST' is activated, all the test mode signals 'STM<0:125>' of the first group are inactivated. At the same time that the reset signal 'CRST' is activated one of the test mode signals 'TM_CUR1' and 'TM_CUR2' of the second group can be activated.

In a conventional test control circuit, the activated test mode signal in the concurrent test can be inactivated only when it exits the test mode. That is, while the test mode signals are activated in the concurrent test, it is not possible to inactivate the test mode signals and therefore the test mode signals test only by applying the test mode signals in the current test. Accordingly, to implement a test mode in the current test, the conventional semiconductor integrated circuit usually goes into a normal mode and then enters into a test mode in the current test only after exiting the previous test mode by resetting all the test modes in the concurrent test using the MRS. As a result, conventional test control circuits require a lot of cycles to convert the tests and then lots of time is needed to test it.

However, according to one embodiment, the concurrent test can be converted into the current test automatically with an entry of a test mode signal, by using test mode signal information of the current test in generating a reset signal.

Figure 2:
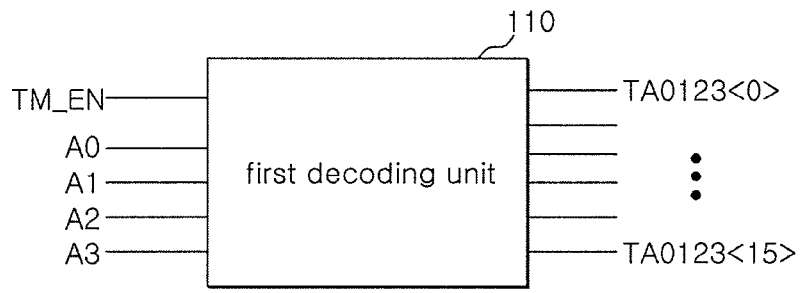
FIG. 2 is a block diagram illustrating an example of a structure of an address decoder in FIG. 1.
Figure 2:
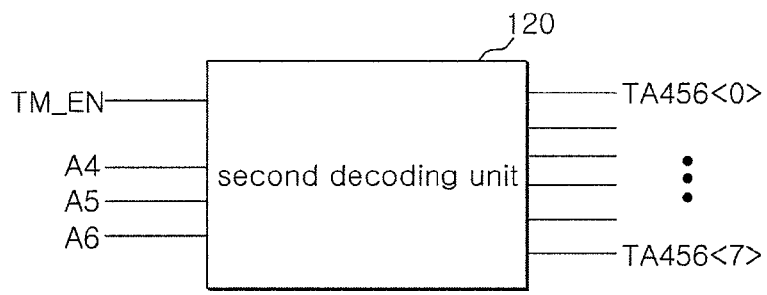

FIG. 2 is a block diagram illustrating an example of a structure of the address decoder 100 in FIG. 1.

Referring to FIG. 2, the address decoder 100 can include first and second decoding units 110 and 120, respectively.

The first decoding unit 110 provides sixteen test mode control signals 'TA0123<0:15>' by decoding the inputted test mode activation signal 'TM_EN' and the inputted four address signals 'A0', 'A1', 'A2' and 'A3'.

The second decoding unit 110 provides eight mode control signals 'TA056<0:7>' by decoding the inputted test mode activation signal 'TM_EN' and the inputted three address signals 'A4', 'A5' and 'A6'.

Since the first and second decoding units (110 and 120) can be implemented by conventional decoders, the detailed description will be omitted from this disclosure. Furthermore, even though the address signals are grouped into two parts, this grouping is not limited to these two groups and it is then possible to group these address signals into various groups.

The test mode signals 'STM<0:125>' of the first group in the concurrent test and the test mode signals 'TM_CUR1' and 'TM_CUR2' of the second group in the current test can be provided by using the plurality of test mode control signals 'TA0123<0:15>', 'TA456<0:7>' provided from the address decoder 100.

Figure 3:
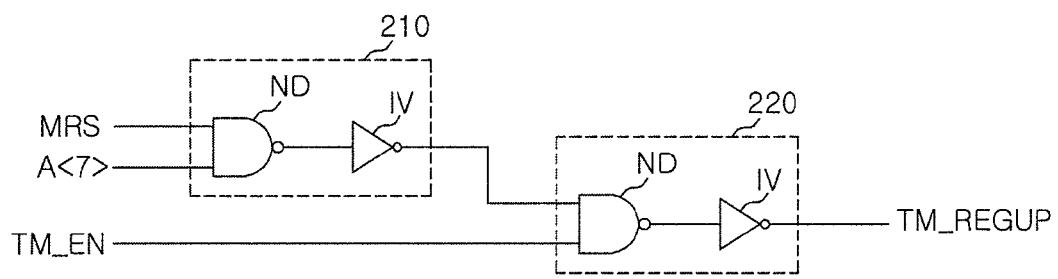
FIG. 3 is a block diagram illustrating an example of a structure of a test mode pulse signal generating unit in FIG. 1.

FIG. 3 is a block diagram illustrating an example of a structure of the test mode pulse signal generating unit 200 in FIG. 1.

Referring to FIG. 3, the test mode pulse signal generating unit 200 can include first and second signal combining units 210 and 220.

The first signal combining unit 210 combines a MRS signal and the address signal 'A<7>' for the entry of test mode. The first signal combining unit 210 can include a NAND gate ND and an inverter IV.

The second signal combining unit 220 produces the pulse signal 'TM_REGUP' by combining an output signal of the first signal combining unit 210 and the test mode activation signal 'TM_EN'. The second signal combining unit 220 can include a NAND gate ND and an inverter IV.

At the time of the entry of the test mode, an operation of the test mode pulse signal generating unit 200 will be described below.

The first signal combining unit 210 receives the MRS signal and the test mode entry address signal 'A<7>' and then outputs a high-level signal. Here, the MRS signal is a pulse signal that is an activated signal when the semiconductor integrated circuit enters or exits the test mode. The output signal of the first signal combining unit 210 is an activated signal that has a pulse width correspondent to the MRS signal.

The second signal combining unit 220 combines the test mode activation signal 'TM_EN' and the output signal of the first signal combining unit 210 and then produces the activated pulse signal 'TM_REGUP' which is delayed more than the test mode activation signal 'TM_EN'.

In contrast, at the time of the exit of the test mode, the first signal combining unit 210 receives the activated MRS signal and the inactivated test mode entry address signal 'A<7>' and then outputs a low-level signal. The second signal combining unit 220, which receives the low-level signal, produces the pulse signal 'TM_REGUP' in a fixed level.

As mentioned above, since the MRS signal is a pulse signal activated when the semiconductor integrated circuit enters or exits the test mode, the test mode entry address signal 'A<7>' is used as a flag signal indicative of the test mode. Accordingly, the test mode activation signal 'TM_EN' is exemplarily illustrated as a signal that is activated in response to the test mode entry address signal 'A<7>' used as the flag signal at the test mode and is inactivated at a normal mode.

On the other hand, the MRS signal, a pulse signal, is inactivated immediately after it is activated once in a pulse. However, while the test mode entry address signal 'A<7>' is activated, the test mode activation signal 'TM_EN' is activated. Therefore, while the test mode activation signal 'TM_EN' is activated, the test mode (not normal section) is continuously maintained. Furthermore, at the time of the test mode, the pulse signal 'TM_REGUP' is inactivated after it is activated with a predetermined pulse width in response to the MRS signal at the test mode. However, at the time of the exit of the test mode, the pulse signal 'TM_REGUP' is maintained in an inactivation state even though the MRS signal is activated.

Figure 4:
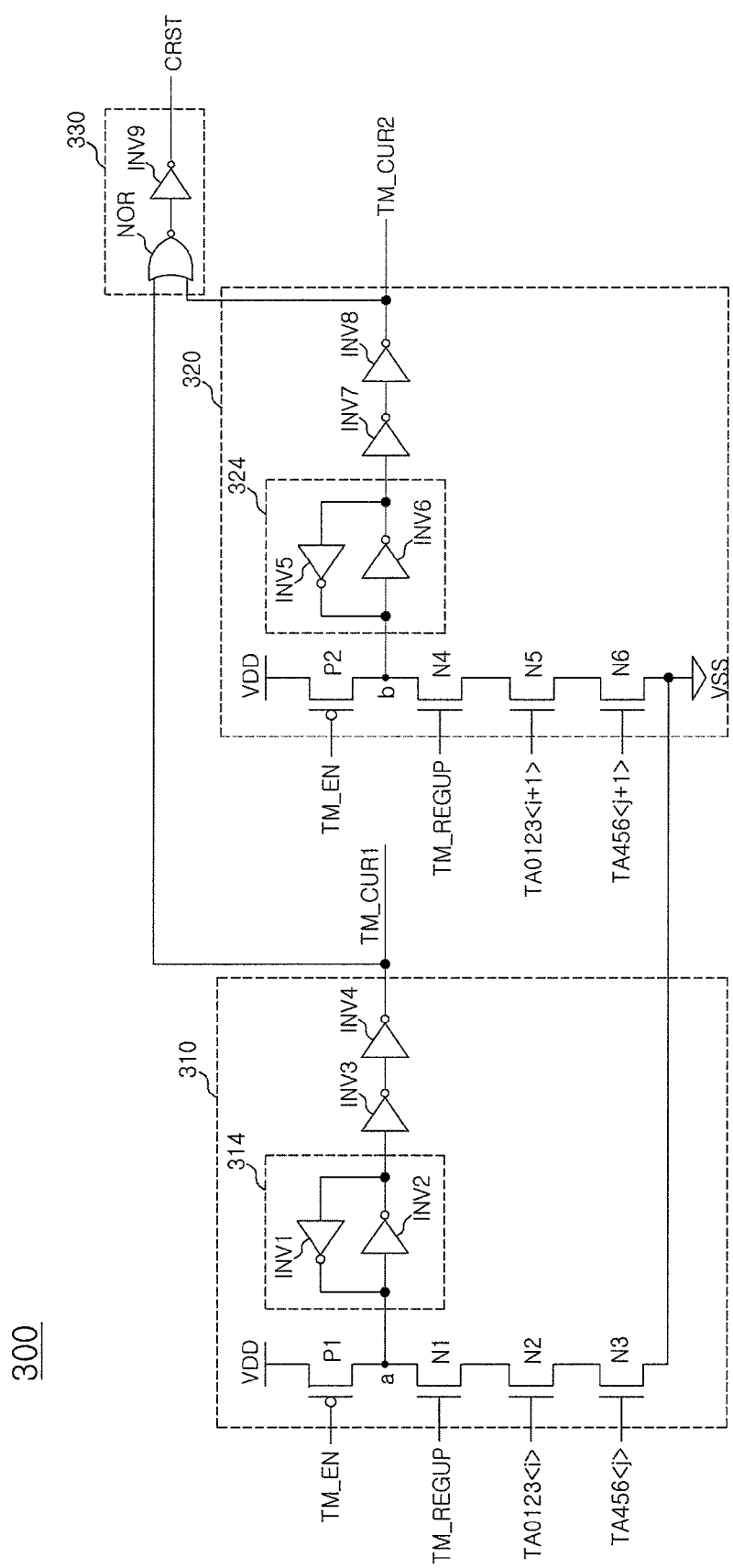
FIG. 4 is a block diagram illustrating an example of a structure of a test mode reset signal generating unit in FIG. 1.

FIG. 4 is a block diagram illustrating an example of a structure of the test mode reset signal generating unit 300 in FIG. 1.

Referring to FIG. 4, the test mode reset signal generating unit 300 can include first and second reset control signal generating units 310 and 320, respectively, and a signal combining unit 330.

The first reset control signal generating unit 310 produces the first current test mode signal 'TM_CUR1' of the test mode signals of the second group in response to predetermined test mode control signals 'TA0123<i>' and 'TA456<j>'.

The second reset control signal generating unit 320 produces the second current test mode signal 'TM_CUR2' of the test mode signals of the second group in response to predetermined test mode control signals 'TA0123<i+1>' and 'TA456<j+1>'.

In more detail, the first reset control signal generating unit 310 produces an activation signal of the first current test mode signal 'TM_CUR1' when the test mode control signals 'TA0123<i>' and 'TA456<j>' of the second group of the plurality of test mode control signals 'TA0123<0:15>' and 'TA456<0:7>' are input. In a similar manner as to the first reset control signal generating unit 310, the second reset control signal generating unit 320 produces an activation signal of the second current test mode signal 'TM_CUR2' when the test mode control signals 'TA0123<i+1>' and 'TA456<j+1>' of the second group of the plurality of test mode control signals 'TA0123<0:15>' and 'TA456<0:7>' are input.

The first reset control signal generating unit 310 can include a first PMOS transistor P1, a plurality of NMOS transistors (N1, N2 and N3) and a latch unit 314.

The first PMOS transistor P1 has a gate to which the test mode activation signal 'TM_EN' is applied, a source to which an external supply voltage VDD is applied, and a drain to which a node "a" is connected.

The first NMOS transistor N1 has a gate to which the pulse signal 'TM_REGUP' is applied, a drain to which a node "a" is connected, and a source that is connected to the second NMOS transistor N2. The second and third NMOS transistors N2 and N3 are connected in series to each other. The test mode control signals 'TA0123<i>' and 'TA456<j>' are applied to the gates of the second and third NMOS transistors N2 and N3, respectively.

The latch unit 314 can include first and second inverters INV1 and INV2 which are connected to each other in a latch type configuration.

The second reset control signal generating unit 320 can include a second PMOS transistor P2, a plurality of NMOS transistors (N4, N5 and N6) and a latch unit 324.

The second PMOS transistor P2 has a gate to which the test mode activation signal 'TM_EN' is applied, a source to which an external supply voltage VDD is applied, and a drain to which a node "b" is connected.

The fourth NMOS transistor N4 has a gate to which the pulse signal 'TM_REGUP' is applied, a drain to which a node "b" is connected, and a source that is connected to the fifth NMOS transistor N5. The fifth and sixth NMOS transistors N5 and N6 are connected in series to each other. The test mode control signals 'TA0123<i+1>' and 'TA456<i+1>' are applied to the gates of the fifth and sixth NMOS transistors N5 and N6, respectively.

The latch unit 324 can include fifth and sixth inverters INV5 and INV6 which are connected to each other in a latch type configuration.

The first reset control signal generating unit 310 has the same configuration as the second reset control signal generating unit 320, even if the input signals are different from each other. Therefore, only the first reset control signal generating unit 310 will need to be described below.

When the test mode activation signal 'TM_EN' is activated, the first PMOS transistor P1 that receives a high-level signal is turned off. At this time, when the pulse signal 'TM_REGUP' and the test mode control signals 'TA0123<i>' and 'TA456<j>' are activated, the first to third NMOS transistors N1 to N3 are turned on and the node "a" is in a low level state. The low-level signal on the node "a" is transited to a high-level signal through the latch unit 314 and through the third and fourth inverters INV3 and INV4. Accordingly, the activation signal of the first current test mode signal 'TM_CUR1' is provided.

Meanwhile, the test mode control signals 'TA0123<i>' and 'TA456<j>' for the predetermined current test can be provided in synchronization with a new MRS signal (not shown). As mentioned above, the pulse signal 'TM_REGUP' is a signal which is activated at the time of the entry of the test mode. Therefore, when the MRS signal is activated, the pulse signal 'TM_REGUP' can also be activated in synchronization with the MRS signal.

In the case where the semiconductor integrated circuit exits the test mode, the first and second current test mode signals 'TM_CUR1' and 'TM_CUR2' will be described below. At the time of the exit of the test mode, the MRS signal is activated and the test mode entry address signal 'A<7>' is inactivated. Accordingly, both the test mode activation signal 'TM_EN' and the pulse signal 'TM_REGUP' are inactivated. Therefore, the first PMOS transistor P1 which receives a low-level signal is turned on and the node "a" is in a high level. As a result, the first current test mode signal 'TM_CUR1' is provided as an inactivated signal in a low level state. That is, the inactivation of the first and second current test mode signals 'TM_CUR1' and 'TM_CUR2' of the second group can be achieved by exiting the test mode.

Likewise, the second test signal generating unit 320 can produce the second current test mode signal 'TM_CUR2' when the test mode control signals 'TA0123<i+1>' and 'TA456<j+1>' for the predetermined current test mode are activated in synchronization with a new MRS signal.

The signal combining unit 330 produces the reset signal 'CRST' by combining the first and second current test mode signals 'TM_CUR1' and 'TM_CUR2', i.e., the test mode signals of the second group. The signal combining unit 330 can include a NOR gate NOR and a ninth inverter INV9. Therefore, the signal combining unit 330 provides the activated reset signal 'CRST' in response to an activation of any one of the first and second current test mode signals 'TM_CUR1' and 'TM_CUR2'. One embodiment of the disclosure, the reset signal 'CRST' is illustrated as, but not limited to, a signal which is activated during the activation of anyone of the first and second current test mode signals 'TM_CUR1' and 'TM_CUR2'. A pulse signal can be generated as the reset signal 'CRST' by using a pulse generator.

Figure 5:
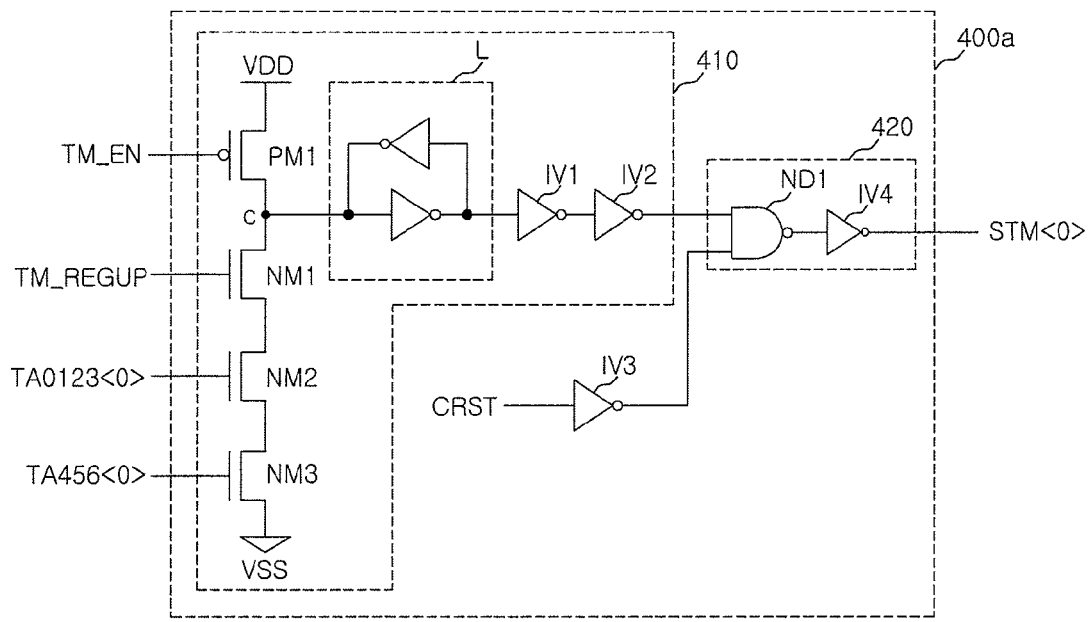
FIG. 5 is a block diagram illustrating an example of a structure of a test mode signal selection unit in FIG. 1.
Figure 5:
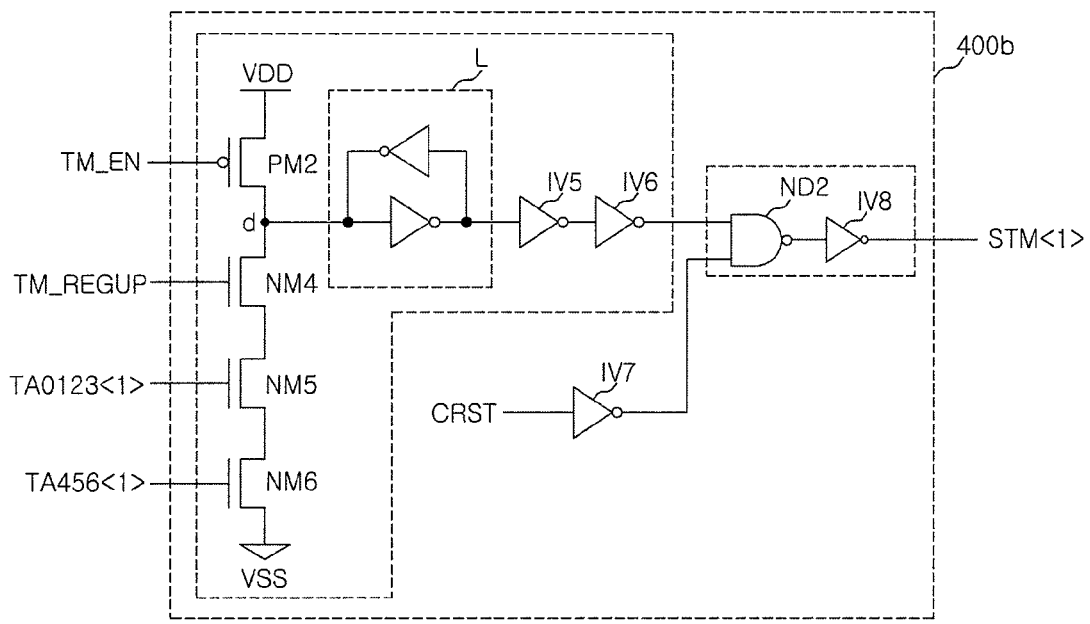

FIG. 5 is a block diagram illustrating an example of a structure of the test mode signal selection unit 400 in FIG. 1.

Referring to FIG. 5, the test mode signal selection unit 400 can include a plurality of test mode signal generating units 400a and 400b.

Each of the test mode signal generating units 400a and 400b can be activated in response to the plurality of test mode control signals 'TA0123<0:15>' and 'TA456<0:7>' and provide the plurality of test mode signals 'STM<0:125>' to be inactivated in response to the reset signal 'CRST'.

The test mode signal generating units 400a and 400b have the same configuration and operation and, therefore, the first test mode signal generating unit 400a will only need to be described below.

The first test mode signal generating unit 400a provides the first test mode signal 'STM<0>' of the first group in response to predetermined signals of the plurality of test mode control signals 'TA0123<0:15>' and 'TA456<0:7>', i.e., the combination of the first test mode control signals 'TA0123<0>' and 'TA456<0>'.

The test mode signal generating unit 400a can include a test mode activation unit 410 and the signal combining unit 420.

Since the test mode activation unit 410 has a configuration similar to the first reset control signal generating unit 310 of FIG. 4 in which it will be described shortly.

The test mode activation unit 410 can include a first PMOS transistor PM1, a plurality of NMOS transistors (NM1, NM2 and NM3) and a latch unit L.

When the test mode control signals 'TA0123<0>' and 'TA456<0>' of the first group are activated, the test mode activation unit 410 provides an activated high-level signal to the signal combining unit 420. At this time, the signal combining unit 420 can provide the first test mode signal 'STM<0>' by combining the reset signal 'CRST' and an output signal of the test mode activation unit 410. When the reset signal 'CRST' is an activated in a high-level signal, this signal is inverted by a third inverter IV3 and provided to the signal combining unit 420. Therefore, the signal combining unit 420 provides the first test mode signal 'STM<0>' of an inactivated low-level signal.

As mentioned above, since the plurality of the test mode signal generating units 400a and 400b are provided, the plurality of signals of the test mode signals of the first group can be activated during the inactivation section of the reset signal 'CRST'. If the reset signal 'CRST' is activated, the activation signals of the test mode signals 'STM<0:125>' of the first group are inactivated. In other words, when the reset signal 'CRST' is activated, one of the test mode signals 'TM_CUR1' and 'TM_CUR2' of the second group is activated.

FIG. 6 is a timing chart showing an operation of the semiconductor integrated circuit in FIG. 1.

Referring to FIGS. 1 to 6, the time period between t0 and t1 is an entry section of the test mode based on the MRS signal and the test mode entry address signal 'A<7>'. A predetermined test mode control signals 'TA0123<m>' and 'TA456<k>' and the test mode signal 'STM<mk>' are activated in synchronization with the activated pulse signal 'TM_REGUP'. Even though only one test mode signal 'STM<mk>' is illustrated, a plurality of the test mode signals can be activated.

The time period between t2 and t3 is a section in which the test mode address signals of the second group are applied. Accordingly, a new MRS signal is activated and the pulse signal 'TM_REGUP' is activated in response to such the MRS signal. At this time, the test mode control signals 'TA0123<i>' and 'TA456<j>' of the second group and the first current test mode signal 'TM_CUR1' are activated in response to the pulse signal 'TM_REGUP'. As a result, the reset signal 'CRST' is activated in response to the first current test mode signal 'TM_CUR1'. The test mode control signals 'TA0123<m>' and 'TA456<k>' and the test mode signal 'STM<mk>' which are initially activated are then subsequently inactivated in response to the activated reset signal 'CRST'.

After the time period of t4, the test mode exits based on the activated MRS signal and the inactivated test mode entry address signal 'A<7>'. The test mode control signals 'TA0123<i>' and 'TA456<j>' and the first current test mode signal 'TM_CUR1' of the second group are inactivated in synchronization with the inactivated test mode activation signal 'TM_EN'.

As apparent from the above, even though various test modes are simultaneously carried out, a new test mode can be further executed by producing a reset signal using the predetermined test mode signals and then resetting the previous test mode. That is, the test time can be reduced by inactivating the previous test mode using a reset signal and executing a new test mode without disconnecting the test mode sate.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A semiconductor integrated circuit comprising:
an address decoder configured to decode address signals and provide a plurality of test mode control signals of first and second groups; and
a test mode control unit configured to generate a reset signal and test mode signals of the first and second groups in response to a test mode activation signal and the plurality of the test mode control signals,
wherein the test mode control unit includes:
a test mode reset signal generating unit configured to receive the plurality of test mode control signals and generate test mode signals of the second group and the reset signal at a test mode; and
a test mode signal selection unit configured to receive the plurality of test mode control signals and the reset signal, and generate a plurality of test mode signals of the first group,
wherein when the reset signal is activated, all the plurality of the test mode signals of the first group are inactivated, and the plurality of the test mode signals of the second group are activated with maintaining the test mode, and
when the reset signal is inactivated, the plurality of the test mode signals of the first group are activated.

2. The semiconductor integrated circuit of claim 1, wherein the address decoder includes:
a first decoding unit configured to decode a first group of the address signals; and
a second decoding unit configured to decode a second group of the address signals.

3. The semiconductor integrated circuit of claim 1, wherein the test mode reset signal generating unit is configured to generate the reset signal when a combination of the test mode control signals of the second group is a same as that of the test mode signals of the second group.

4. The semiconductor integrated circuit of claim 1, wherein the test mode reset signal selection unit is configured to generate the plurality of activation signals of the test mode signals of the first group when the reset signal is inactivated.

* * * * *